United States Patent [19]

Fujimoto et al.

[11] Patent Number: 5,577,086
[45] Date of Patent: Nov. 19, 1996

[54] CLOCK SIGNAL GENERATION CIRCUIT CAPABLE OF OPERATING AT HIGH SPEED WITH HIGH FREQUENCY

[75] Inventors: Yukihiro Fujimoto; Kazutaka Nogami, both of Yokohama, Japan

[73] Assignee: Kabushiki Kaisha Toshiba, Kawasaki, Japan

[21] Appl. No.: 365,479

[22] Filed: Dec. 28, 1994

[30] Foreign Application Priority Data

Dec. 28, 1993 [JP] Japan ..................... 5-336394

[51] Int. Cl.$^6$ ................. H03D 3/24; H03L 7/00
[52] U.S. Cl. ............. 375/376; 331/1 A; 331/14; 331/18; 331/2.5; 331/34
[58] Field of Search ..................... 375/374, 376, 375/373, 375; 331/1 R, 1 A, 14, 25, 34, 18, 16, 17, 36 R, 36 C, 36 L, DIG. 2; 327/141, 144, 147, 150, 156, 159, 162

[56] References Cited

U.S. PATENT DOCUMENTS

| | | | |
|---|---|---|---|
| 5,202,906 | 4/1993 | Saito et al. ................. | 331/14 |
| 5,272,453 | 12/1993 | Traynor et al. ............. | 331/34 |
| 5,285,483 | 2/1994 | Ogawa et al. .............. | 375/376 |
| 5,304,955 | 4/1994 | Atriss et al. ............... | 331/1 R |
| 5,410,571 | 4/1995 | Yonehawa et al. ......... | 375/376 |
| 5,410,572 | 4/1995 | Yoshida ...................... | 375/376 |

*Primary Examiner*—Wellington Chin
*Assistant Examiner*—Huong Luu
*Attorney, Agent, or Firm*—Foley & Lardner

[57] ABSTRACT

A clock signal generation circuit performs a stable operation with respect to both a high frequency input clock signal and a sufficient low frequency testing clock signal. The circuit includes a phase comparator for generating a phase difference output corresponding to a phase difference between an internal clock signal and a reference clock signal externally supplied; a frequency distinction circuit for generating a frequency change-over signal when a frequency of the reference clock signal is lower than a preset reference signal; a loop filter for generating an output voltage corresponding to the phase difference output and for changing over a filter constant to that for a low frequency corresponding to the frequency change-over signal; and a voltage control oscillator for setting a frequency of the internal clock signal to a frequency corresponding to the output voltage of the loop filter and for decreasing a change amount of an oscillating frequency with respect to an input signal corresponding to the frequency change-over signal.

5 Claims, 6 Drawing Sheets

CLOCK SIGNAL GENERATION CIRCUIT CAPABLE OF OPERATING AT HIGH SPEED WITH HIGH FREQUENCY

BACKGROUND OF THE INVENTION

The present invention relates to a clock signal generation circuit of a phase locked loop (PLL) type, and more especially to a clock signal generation circuit applicable to be used in a semiconductor integrated circuit device capable of operating at a high speed with a high frequency.

Recently, there have been developed various semiconductor devices assuming a part as a microprocessor and a peripheral circuit of the microprocessor. Such semiconductor devices are required to be operated with a high frequency, and it is necessary for each semiconductor device to operate in synchronous with clocks in a system and clocks supplied from the outside because a plurality of chips are combined to use. In such a large scale integrated (LSI) circuit which is formed in the semiconductor device operating at a high speed, the clock signal generation circuit using a phase locked loop (PLL) circuit controls an internal clock signal in an LSI in order to decrease a delay of a clock signal of the internal circuit against an input clock signal supplied from the outside to the chip, and in order to make synchronous with clock signals of other LSIs.

Figure 1:
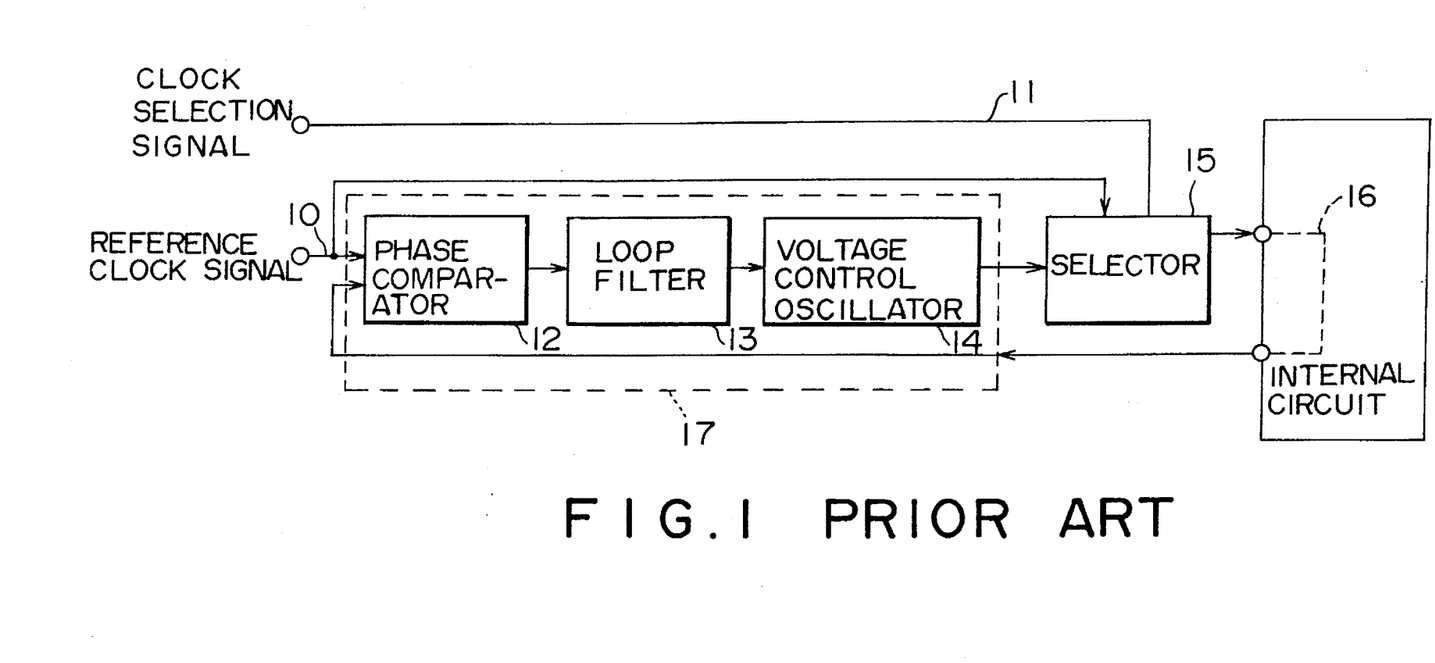
FIG. 1 is a block diagram showing an example of the conventional clock signal generation circuit of the phase locked loop type.

FIG. 1 shows a clock signal generation circuit of the PLL type in the conventional semiconductor circuit device. In this example, the clock signal generation circuit comprises a phase locked loop (PLL) circuit 17 and a selector 15.

The PLL circuit 17 comprises a phase comparator 12 for detecting a phase difference between a reference clock signal 10 supplied from the outside and an internal clock signal 16 used in an internal LSI circuit, a loop filter 13 for outputting a direct current corresponding to a phase difference output of the phase comparator 12, and a voltage control oscillator (VCO) 14 of a variable frequency for oscillating at a frequency corresponding to an output voltage of the loop filter 13. The voltage control oscillator 14 supplies a clock signal 16 into the LSI through the selector 15 at normal operation. The internal clock signal 16 is inputted through the LSI circuit into the phase comparator 12 to compare with the reference clock signal 10 supplied from the outside.

In the above construction, when the phases are discrepant between the reference clock signal 10 and the internal clock signal 16, the phase comparator 12 detects the phase difference, and an output potential of the loop filter 13 increases and decreases corresponding to the phase difference. The output signal causes the voltage control oscillator 14 to change an oscillation frequency in the direction to cancel the phase difference. Such operation is repeated in the phase locked loop to decrease the phase difference between two clock signals. When the phase comparator 12 does not detect the phase difference, the loop filter 13 holds an output potential at that time, and the voltage control oscillator 14 continues to generate the internal clock signal 16 whose phase synchronizes with that of the reference clock signal 100 thereby resulting in the PLL circuit 17 being in the locked condition against the reference clock signal. The selector 15 corresponds to a clock selection signal externally supplied to select any of the external clock signal 10 and an internal clock signal outputted from the PLL circuit 17 so as to supply a selected signal to the internal circuit of the semiconductor device. Therefore, it is possible to change over the external clock signal 10 and the internal clock signal 16 to use a switched signal in the internal circuit.

In this manner, by using the PLL circuit 17, the internal clock signal 16 in the LSI perfectly synchronizes without the phase difference against the external reference clock signal 10, thereby resulting in an advantage in which a delay does not occur in the internal clock signal because of a buffering of the input portion.

By the way, the PLL circuit 17 has a limit of a frequency range of the clock signal capable of synchronizing because a change amount (gain) of the oscillating frequency against an input voltage of the voltage control oscillator 14 is set to be optimum within a high frequency level in ordinary operation, for example, in 10–100 MHz. When an input frequency is low enough to correspond to a design frequency, for example, on or under 1 MHz, the gain is too large to largely change the oscillating frequency by a fine change of an input potential influenced by noises, thereby resulting in unstable operation of the PLL circuit. Furthermore, since the voltage control oscillator 14 can not oscillate a clock signal having such a low frequency, the necessary clock signal can not be generated.

Therefore, when a burn-in test for estimating the LSI must be performed at a low clock frequency (low speed) because of no high speed testing device, the PLL circuit 17 can not be locked to generate a synchronous clock signal.

Accordingly, at testing in low speed operation, the selector circuit 15 divides the output clock signal of the PLL circuit 17 and the clock signal in the LSI by the above-mentioned clock selection signal, and directly receives the input clock signal 10 externally supplied as the internal clock signal. Since operation is performed in low speed at this time, the delay of the input clock signal 10 and internal clock signal does not influence operation of the LSI, and it is unnecessary for the PLL circuit 17 to generate the clock signal and it is no problem in operation of the LSI.

However, since the clock signal generation circuit does not operate the PLL circuit 17 at an estimation, the phase locked loop circuit itself is not an object of the estimation. Therefore, since the PLL circuit 17 does not operate in the burn-in testing and an operational stress can not add to only the portion, the entire LSI can not be sufficiently estimated.

Furthermore, since the clock selection signal 11 is supplied from the outside for changing over a clock signal generation source, it is a problem that input terminals for testing (IC package terminals) increase.

Accordingly, even though testing of operation at a low frequency is not performed frequently, it is necessary to set a special mode for the testing and to provide a signal pin for setting the special mode. However, in a static random access memory (SRAM), since the signal pins are limited to provide the signal pins around the side wall of the package, there is a large demerit to providing the specific pin for low speed operation testing.

SUMMARY OF THE INVENTION

In view of the above-mentioned condition, an object of the present invention is to provide a clock signal generation circuit of a phase locked loop type for performing stable operation with respect not only to an input clock signal having a high frequency but also to an input clock signal having a sufficient low frequency.

Another object of the present invention is to provide a clock signal generation circuit in which it is unnecessary to provide a special input terminal in order to change over an operation frequency of the clock signal generation circuit.

In order to achieve the above objects, the clock signal generation circuit according to the present invention comprises a phase comparator for generating a phase difference output corresponding to a phase difference between an internal clock signal and a reference clock signal externally supplied, a frequency distinction circuit for generating a frequency change-over signal when a frequency of the reference clock signal is lower than a preset reference signal, a loop filter for generating an output voltage corresponding to the phase difference output and for changing over a filter constant to that for a low frequency corresponding to the frequency change-over signal, and a voltage control oscillator for setting a frequency of the internal clock signal to a frequency corresponding to the output voltage of the loop filter and for decreasing a change amount of an oscillating frequency against an input signal corresponding to the frequency change-over signal.

When a supplied input clock signal for testing is lower than a normal operation frequency, the frequency distinction circuit detects the clock signal to generate the frequency change-over signal so as to set the phase locked loop to that for operating at a low frequency. Therefore, the change amount (gain) of the oscillating frequency is set to be small with respect to the input of the voltage control oscillator, and in accordance with this, the filter constant is also set to that for operating at the low frequency.

As a result, in spite of high or low frequency of the input clock signal, a characteristic of the phase locked loop is set automatically corresponding to the frequency of the input clock signal, thereby causing operation of the clock signal generation circuit to be stable against two input clock signals in which respective frequencies are largely different from each other. Furthermore, it is unnecessary to provide other input terminals for controlling operation of the clock signal generation circuit.

As described above, since the clock signal generation circuit of the phase locked loop type according to the present invention automatically sets the characteristic of the phase locked loop to match with the frequency of the input clock signal corresponding to high or low frequency of the input clock signal externally supplied, it is possible to operate the clock signal generation circuit in a stable manner with respect to two input clock signals having frequencies largely different from each other. Furthermore, since operation of the clock signal generation circuit is changed according to the change of the frequency of the input clock signal, it is unnecessary to provide another input terminal for the control.

DETAILED DESCRIPTION OF THE PREFERRED EMBODIMENTS

There will be described in detail a clock signal generation circuit according to preferred embodiments of the present invention with reference to the attached drawings.

Figure 2:
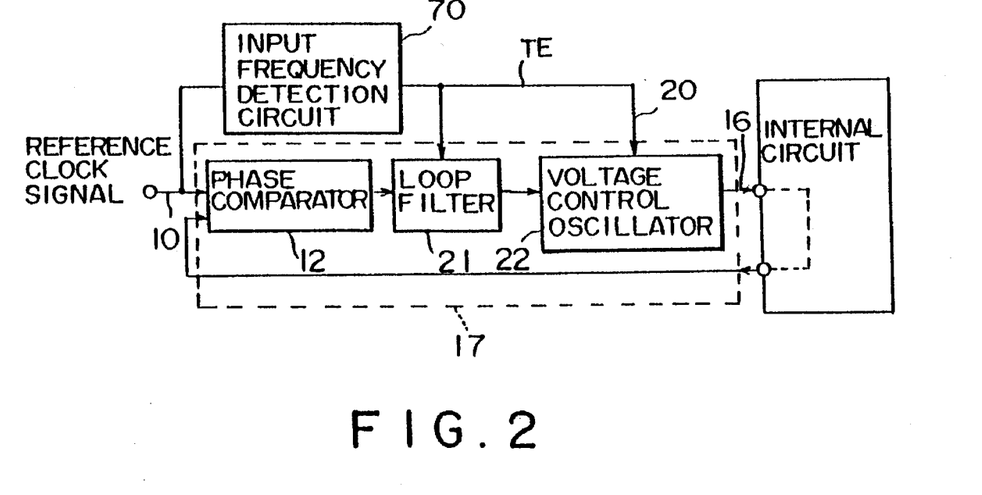
FIG. 2 is a block diagram showing a clock signal generation circuit according to a first embodiment of the present invention.

FIG. 2 shows a clock signal generation circuit according to a first embodiment of the present invention. In the first embodiment, an input frequency detection circuit 70 is provided in the clock signal generation circuit to generate a transverse electric (TE) signal 20 by detecting a frequency of a reference clock signal externally supplied so as to change over a gain of a voltage control oscillator 22 and a characteristic of a loop filter 21.

In FIG. 2, portions corresponding to those of the conventional circuit shown in FIG. 1 are identified by the same numerals. The phase locked loop (PLL) circuit 17 comprises a phase comparator 12 for detecting a phase difference between two clock signals, a loop filter 21 capable of changing over a characteristic, and a voltage control oscillator 22 of a variable gain and capable of changing over a change amount (gain) of the oscillation frequency against an input voltage. The characteristic selection of the loop filter 21 and the change-over of the voltage control oscillator 22 are controlled by the TE signal 20 as a frequency change-over instruction outputted from the input frequency detection circuit 70 which generates the TE signal after the high or low frequency is distinguished and when the frequency is on or less than the predetermined frequency.

Figure 3:
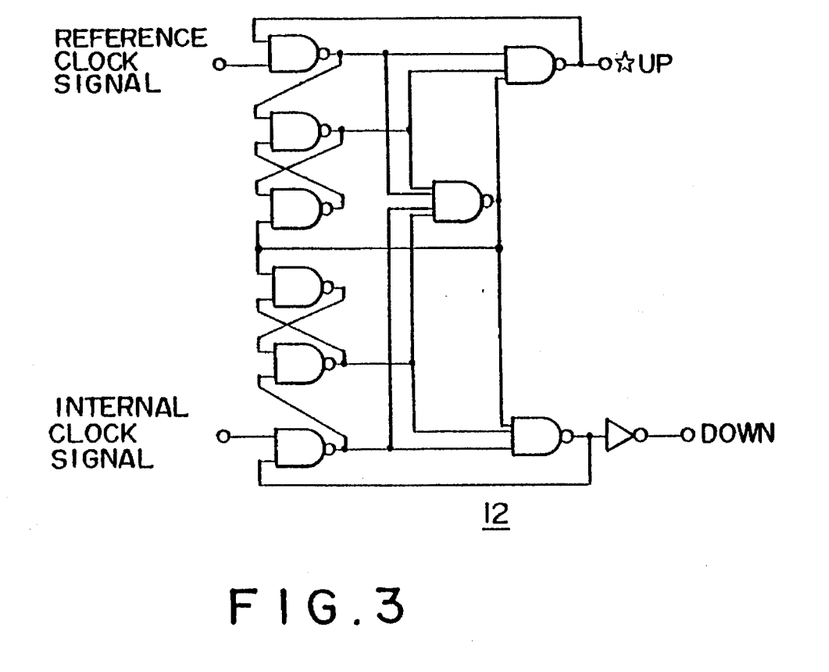
FIG. 3 is a circuit diagram showing a construction example of a loop filter 21 used in the first embodiment shown in FIG. 2.

FIG. 3 shows a construction example of the phase comparator 12 which is used in the clock signal generation circuit according to the first embodiment of the present invention. The phase comparator 12 is comprised of a circuit in which logic gates are combined in FIG. 3 and which has two comparative input ends and an instruction output end. In the FIG. 3 embodiment, the instruction output end has an *UP output and a DOWN output. When an internal clock signal 16 supplied to one of the comparative input ends advances with respect to to a reference clock signal 10 supplied to the other of the comparative input ends, a DOWN instruction output is generated at the output end. On the contrary, when the internal clock signal 16 is delayed with respect to the reference clock signal 10, an *UP output is generated at the output. These outputs are issued for a time interval corresponding to a respective phase difference.

Figure 4:
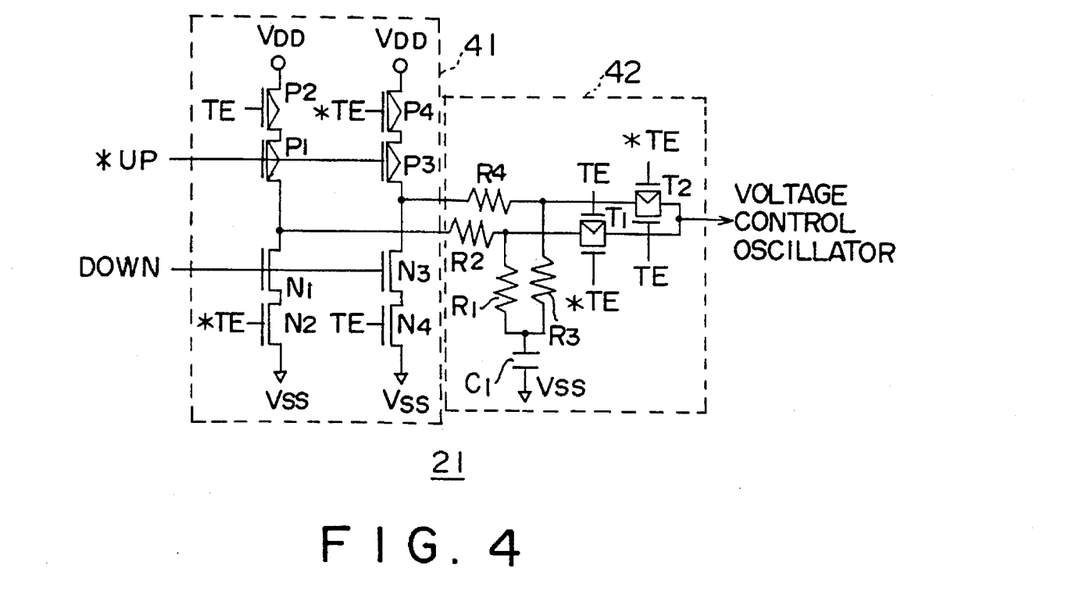
FIG. 4 is a circuit diagram showing a construction example of a loop filter 21 used in the first embodiment shown in FIG. 2.

FIG. 4 shows a construction example of the loop filter 21 which is used in the clock signal generation circuit according to the first embodiment. The loop filter 21 comprises a charge pump portion 41 and a low pass filter 42.

Furthermore, the charge pump portion 41 comprises first and second charge pump circuits. The first charge pump circuit is comprised of a series connection of P-MOS transistors $P_1$ and $P_2$ and a series connection of N-MOS transistors $N_1$ and $N_2$. The *UP signal and the DOWN signal are supplied to each gate of the transistors $P_1$ and $P_2$, respectively, and a junction point between the transistors $P_1$ and $N_1$ is connected to a filter of the next stage. The TE signal and *TE signal as an inverted signal thereof are supplied to each gate of the transistors $P_2$ and $N_2$, respectively. The second charge pump circuit is comprised of a series connection of P-MOS transistors $P_3$ and $P_4$ and a series connection of N-MOS transistors $N_3$ and $N_4$ and has the configuration the same as that of the first charge pump. The input frequency detection circuit 70 does not activate the TE signal and operates the first charge pump by conducting the transistors $P_2$ and $N_2$. Furthermore, when the low frequency is detected, the circuit 70 activates the TE signal and conducts the transistors $P_4$ and $N_4$ to operate the second charge pump circuit. When the first charge pump circuit is activated, if the *UP signal is supplied to the gate of the transistor $P_1$, a capacitor $C_1$ of the filter is charged. When the DOWN signal is supplied to the gate of the transistor $N_1$, if the *UP signal is supplied to the gate of the transistor $P_3$, the capacitor $C_1$ of the filter is charged, and if the DOWN signal is supplied to a gate of the transistor $N_3$, the capacitor $C_1$ of the filter is discharged.

The low pass filter 42 is comprised of two lag-lead type low pass filters including resistors $R_1$ through $R_4$ and the capacitor $C_1$, and is driven by the first and second charge pump circuits. Two filters constructed by these charge pump circuits and low pass filter circuit are set in the manner that a respective pump current amount and a respective resistor value are different from each other, and only the capacitor $C_1$ of the low pass filter is connected to the resistors $R_1$ and $R_3$ commonly. Output ends of two filters are connected through transfer gates $T_1$ and $T_2$ to a control input end of the voltage control oscillator 22. The transfer gates $T_1$ and $T_2$ are complementarily controlled by the TE and *TE signals in the manner of conducting any of gates $T_1$ and $T_2$ responsive to the selection of the charge pump circuit.

The charge pump portion 41 converts a digital signal (*UP and DOWN) supplied from the phase comparator 12 into an analog amount, and the low pass filter 42 eliminates a high frequency component such as noises and maintains an output potential to the voltage control oscillator 22. The TE signal changes over these pump current amounts and the resistor values to change the characteristic of the loop filter 21.

In general, when a gain of the voltage control oscillator is K, the current amount of the charge pump is I, a resistance value on an input side of the low pass filter is $R_2$, a resistance value on the capacitance side is $R_1$, a capacitance value of the capacitor $C_1$ is C, and an input frequency is f, the following equation (1) is an equation for representing a stability of the phase locked loop circuit:

$$C > \frac{1}{2f} \cdot \frac{1}{(2f/KI) - R_2} \quad (1)$$

Furthermore, a dumping factor $F_D$ can be represented as a parameter showing a corresponding step of the internal clock signal against the reference clock signal by an equation (2) as follows:

$$F_D = \frac{R_2 \sqrt{KIC}}{2} \quad (2)$$

Accordingly, when the gain of the voltage control oscillator is caused to be changed in proportion to the input frequency, the current amount of the charge pump is proportional to the change amount of the gain, and the resistance value of the low pass filter is inversely proportional to the change amount of the gain, thereby maintaining a stability of the phase locking.

Figure 5:
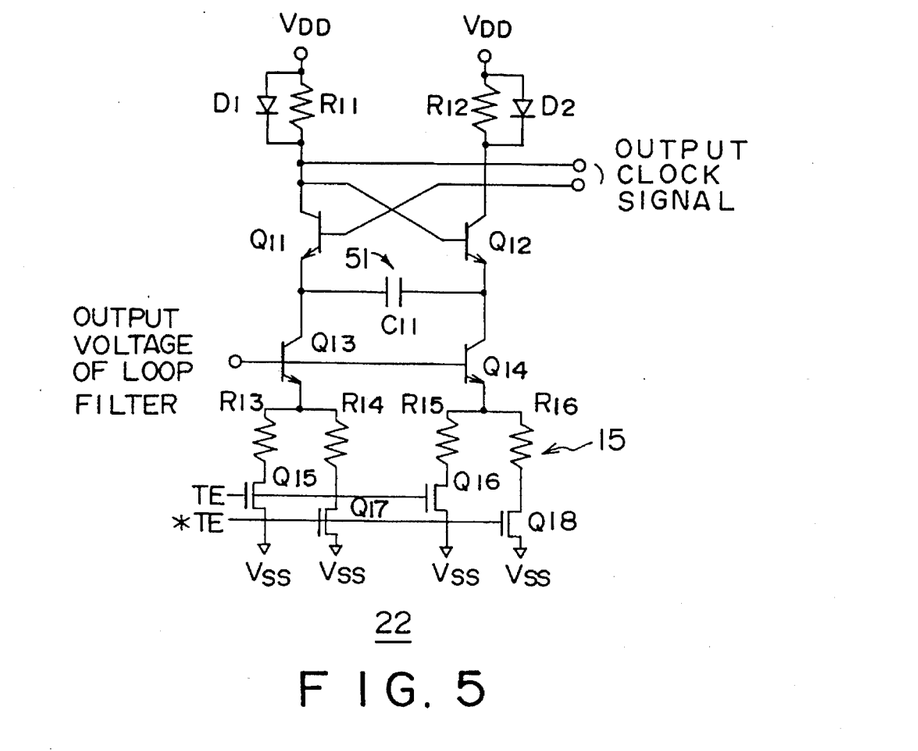
FIG. 5 is a circuit diagram showing a construction example of a voltage control oscillator 22 used in the first embodiment shown in FIG. 2.

FIG. 5 shows an example of the voltage control oscillator 22 of the variable gain type which is used in the present invention. The voltage control oscillator 22 comprises current limit resistors $R_{11}$ and $R_{12}$, current value setting resistors $R_{13}$ through $R_{16}$, level clamp diodes $D_1$ and $D_2$, flip-flop transistors $Q_{11}$ and $Q_{12}$, current control transistors $Q_{13}$ and $Q_{14}$, switching transistors $Q_{15}$ through $Q_{18}$, and a capacitor $C_{11}$.

The circuit is substantially a multivibrator circuit in which collectors of the transistors $Q_{11}$ and $Q_{12}$ are cross connected to bases of the transistors $Q_{12}$ and $Q_{11}$, and emitters of the transistors $Q_{11}$ and $Q_{12}$ are connected with each other through the capacitor $C_{11}$. A constant current source 51 is connected to the emitter side of the transistors $Q_{11}$ and $Q_{12}$ constituting a multivibrator circuit. A frequency of the output clock signal changes corresponding to a current amount flowing in the constant current source 51. Since the gain of the voltage control oscillator is determined by setting the current value of the constant current source 51, the transistors $Q_{15}$ through $Q_{18}$ controlled by the TE and *TE signals select the current value set resistors $R_{13}$ through $R_{16}$ to change over the current level and the gain of the voltage control oscillator 22.

The transistors $Q_{13}$ and $Q_{14}$ are inserted between the current source 51 and the emitters of the transistors $Q_{11}$ and $Q_{12}$ of the multivibrator circuit. An output voltage of the filter 21 is supplied to the bases of the transistors $Q_{13}$ and $Q_{14}$ to fine regulate an emitter current of the transistors $Q_{11}$ and $Q_{12}$ corresponding to a level of the output voltage of the filter 21, thereby increasing and decreasing the oscillating frequency.

Figure 6A:
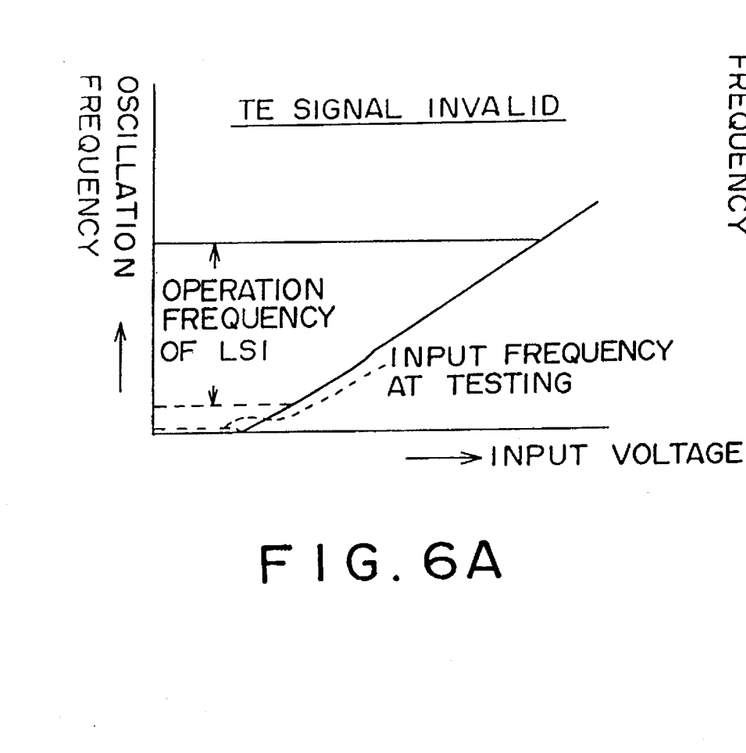
FIG. 6A is an explanatory view showing a characteristic of an oscillation frequency against an input voltage when the TE signal of the VCO shown in FIG. 5 is inactive.

In ordinary high frequency operation generating the internal clocks for the LSI, the TE signal becomes inactive (invalid), and the voltage control oscillator 22 can oscillate within a high frequency range including an operational frequency, as shown in FIG. 6A. Here, in view of the stability of the phase locked loop, the gain of the voltage control oscillator 22 is desired to be constant in spite of the input voltage, and the gain is set to be large in order to be able to oscillate in a high frequency range. At this time, the loop filter 21 changes over the characteristic to match the gain of the voltage control oscillator 22 so as to obtain a stable clock signal in the entire phase locked loop circuit 17.

Figure 6B:
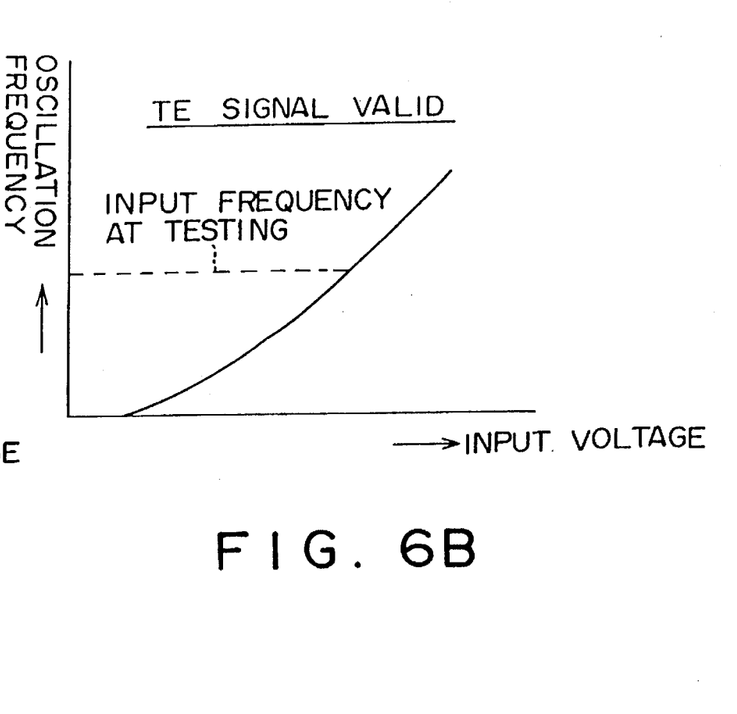
FIG. 6B is an explanatory view showing a characteristic of an oscillation frequency against an input voltage when the TE signal of the VCO shown in FIG. 5 is active.

On the other hand, when the semiconductor device must be operated at a frequency lower than the operational frequency of the LSI such as the burn-in test, the TE signal is activated (valid) to change over the gain of the voltage control oscillator 22, as shown in FIG. 6B, so as to set the oscillation frequency range including a low frequency range at testing. In this case, the characteristic of the loop filter is selected by the TE signal to match the gain of the voltage control oscillator 22 so as to maintain the stability of the entire phase locked loop circuit 17.

Figure 7:
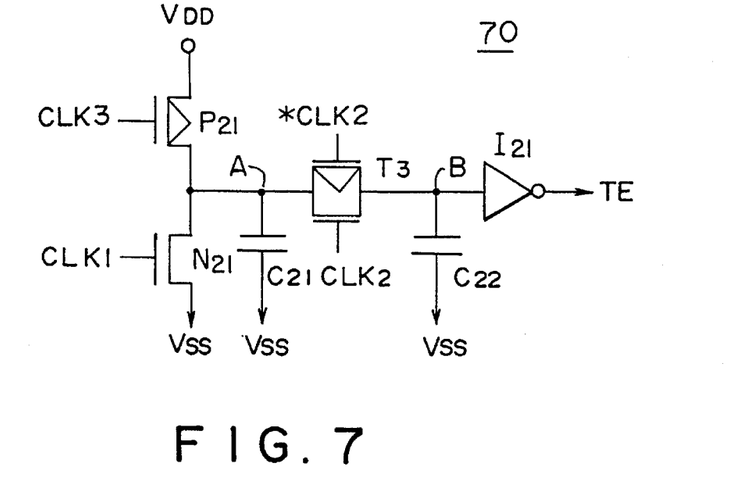
FIG. 7 is a circuit diagram showing a circuit of a second embodiment as a concrete example of an input frequency detection circuit 70 used in the first embodiment shown in FIG. 2.

FIG. 7 shows a clock signal generation circuit according to a second embodiment of the present invention including a concrete construction example of the input frequency detection circuit 70. In FIG. 7, a P-MOS transistor $P_{21}$ and an N-MOS transistor $N_{21}$ are connected in series between a power source $V_{DD}$ and a ground $V_{SS}$. A capacitor $C_{21}$ is connected between the ground $V_{SS}$ and a junction point A between the transistors $P_{21}$ and $N_{21}$. A capacitor $C_{22}$ is connected through a transfer gate $T_3$ between the junction point A and the ground $V_{SS}$. A junction point B between the transfer gate $T_3$ and the capacitor $C_{22}$ is connected to an input terminal of an inverter $I_{21}$ which is connected to each of control input terminals of the filter 21 and voltage control oscillator 23. An output of the inverter $I_{21}$ becomes the above mentioned TE signal.

Figure 8:
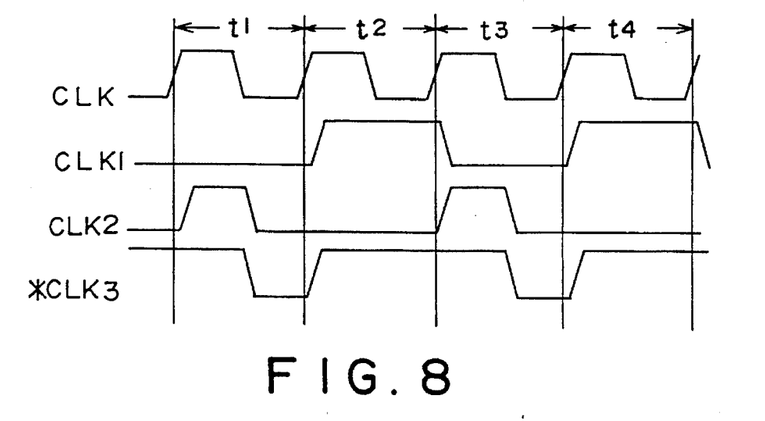
FIG. 8 is a timing chart of a clock signal for explaining operation of the input frequency detection circuit 70 in the second embodiment.

In such a construction, the transistors $P_{21}$ and $N_{21}$ and transfer gate $T_3$ receive clock signals CLK1 through CLK3 which are obtained by a frequency division of the reference clock signal CLK as shown in FIG. 8. Since the transistor $P_{21}$ has a large capacity, the capacitor $C_{21}$ charges to the power voltage $V_{DD}$ during the first cycle $t_1$ when the signal *CLK3 is supplied to the gate of the transistor $P_{21}$. Next, since the transistor $N_{21}$ has a small capacity and operates complementarily with the transistor $P_{21}$ by the signal CLK1, the transistor $N_{21}$ discharges the charge in the capacitor $C_{21}$ to the ground potential $V_{SS}$ step by step during the second cycle $t_2$. At this time, since the discharge time is short compared with the height of the frequency of the input clock signal, the potential of the capacitor $C_{21}$ increases when the signal CLK1 trails. Furthermore, the signal CLK2 opens the transfer gate $T_3$ in the third time period $t_3$ to transfer the potential of the capacitor $C_{21}$ to the capacitor $C_{22}$. After the clock inputs into the circuit, for a little while, the potential of the capacitor $C_{22}$ is controlled to a predetermined potential corresponding to the frequency of the input clock signal. It is impossible to judge (distinguish) high or low frequency of the reference clock signal externally supplied by determining whether the potential is over the threshold value of the inverter $I_{21}$ or not.

Accordingly, since the clock signal generation circuit of the phase locked loop type according to the present invention can operate the phase locked loop circuit even in the estimation time in the same manner as that in normal operation, it is unnecessary to input directly internal clock signal divided from the clock signal supplied from the phase locked loop circuit 17. For example, even when the estimation of the semiconductor device must be performed at a low frequency such as the burn-in test, it is possible to generate a clock signal by the phase locked loop circuit in the same manner as in normal operation. Therefore, since the burn-in test can test the phase locked loop circuit itself, it is possible to increase a discovery rate of a failure because of broadening an estimation range.

Furthermore, since the operation mode of a phase locked loop is selected corresponding to a frequency of the input clock signal (the reference clock signal), it is unnecessary to provide an input terminal for an operation mode (test) selection, thereby decreasing the number of pins.

Figure 9:
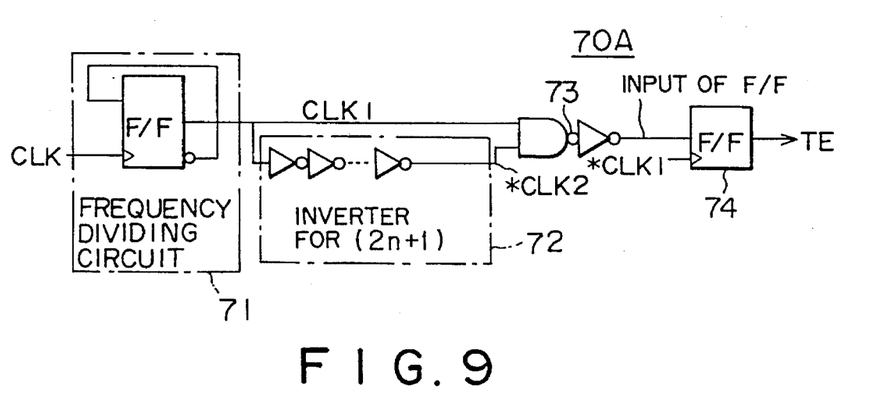
FIG. 9 is a circuit diagram showing a clock signal generation circuit according to a third embodiment as another concrete example of the input frequency detection circuit used in the first embodiment shown in FIG. 2.
Figure 10:
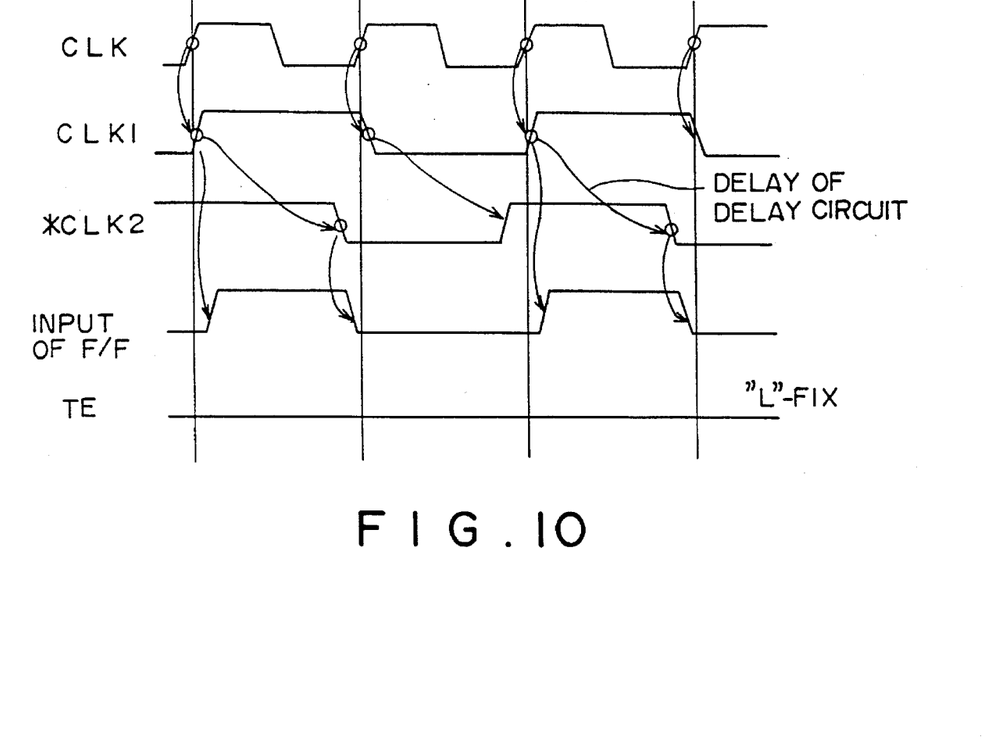
FIG. 10 is a timing chart of the clock signal for explaining operation when there is a low input frequency of the input frequency detection circuit of the third embodiment.
Figure 11:
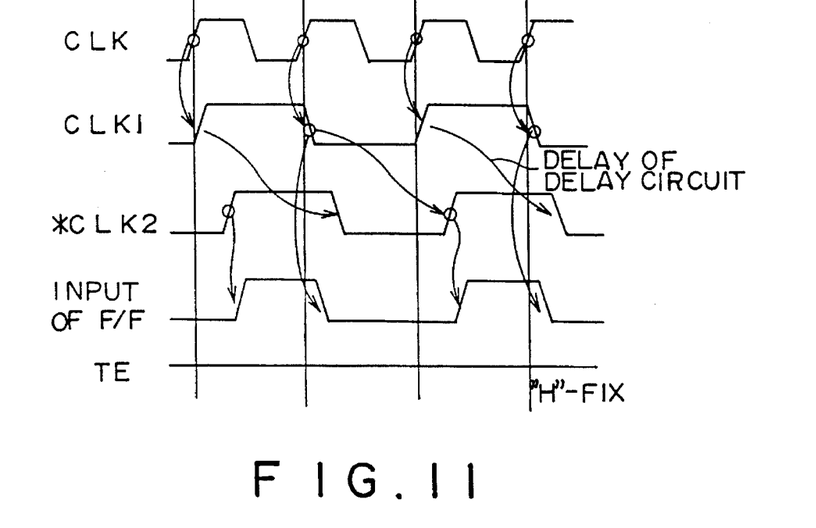
FIG. 11 is a timing chart of the clock signal for explaining operation when there is a high input frequency of the input frequency detection circuit of the third embodiment.

FIGS. 9–11 show a clock signal generation circuit according to a third embodiment including an input frequency detection circuit having another concrete example different from the clock signal generation circuit according to the second embodiment of the present invention.

In FIG. 9, an input frequency detection circuit 70A comprises a frequency division circuit 71 for performing ½ frequency division for the reference clock signal CLK, delay circuit 72 for delaying a frequency divided clock signal CLK1, an AND gate 73 for taking a logical product between the clock signal CLK1 and an output of the delay circuit 72, and a flipflop 74 for latching an output of the AND gate 73 at a trailing edge of the clock signal CLK1.

In the above constitution, when a frequency cycle of the reference clock signal is longer than a delay time of the delay circuit 72, namely, when the input frequency is low, as shown in FIG. 10, the output of the AND gate 73 (an input of the flipflop) has a leading edge at a leading edge of the frequency divisional clock (CLK1) and a trailing edge which is determined by the trailing edge of the delay circuit 72. Since the trailing edge of the output of the AND gate 73 is ordinarily earlier than the trailing edge of the clock signal CLK1, an output of the detection circuit 70A is usually issued as "L". On the contrary, when the frequency cycle of the reference clock signal is shorter than the delay time of the delay circuit 72, namely, when the input frequency is high, as shown in FIG. 11, since the output of the AND gate 73 has a leading edge which is determined by the leading edge of the delay circuit 72 and a trailing edge which is determined by the trailing edge of the clock signal CLK1, the detection circuit 70A usually outputs "H".

In this manner, since the delay time of the delay circuit 72 is set to the proper value, it is possible to detect the frequency of the input clock signal.

The present invention is not limited to the clock signal generation circuit of the above mentioned semiconductor device. The present invention is widely applicable to a phase locked loop circuit provided in a communication system. Also, the present invention can be applied not only to a clock signal generation circuit but also to a sine wave signal generation circuit.

What is claimed is:

1. A clock signal generation circuit capable of operating at a high speed with a high frequency comprising:

a phase comparator for generating a phase difference output corresponding to a phase difference between an internal clock signal and a reference clock signal externally supplied;

a frequency distinction circuit for generating a frequency change-over signal when a frequency of the reference clock signal is lower than a preset frequency;

a loop filter, connected to the phase comparator and to the frequency distinction circuit, for generating an output voltage corresponding to the phase difference output and for changing over a filter constant to that for a low frequency corresponding to the frequency change-over signal; and a voltage control oscillator, connected to the loop filter, for setting a frequency of the internal clock signal to a frequency corresponding to the output voltage of the loop filter and for decreasing a gain of an oscillating frequency with respect to an input signal corresponding to the frequency change-over signal.

2. The clock signal generation circuit according to claim 1; wherein said voltage control oscillator comprises first and second current limit resistors, third through sixth current value setting resistors, first and second level clamp diodes and first and second flip-flop transistors, first through third current control transistors, fourth through seventh switching transistors, and a capacitor.

3. The clock signal generation circuit according to claim 1; wherein said frequency distinction circuit comprises a P-channel metal oxide semiconductor (P-MOS) field effect transistor (FET) connected between a power source and a ground, an N-MOS FET connected in series between the power source and the ground, a transfer gate connected between an output terminal and a junction point of the P-MOS FET and the N-MOS FET, an inverter connected between the output terminal and the transfer gate, a first capacitor connected to a junction point between the transfer gate and said junction point of the P-MOS FET and the N-MOS FET, and a second capacitor connected to a junction point between the transfer gate and the inverter.

4. The clock signal generation circuit according to claim 1; wherein said frequency distinction circuit comprises a frequency division circuit for performing ½ frequency division for the reference clock signal, a delay circuit for delaying a frequency divided clock signal, an AND gate for taking a logical product between the clock signal and an output of the delay circuit, and a flipflop for latching an output of the AND gate at a trailing edge of the clock signal.

5. The clock signal generation circuit according to claim 1; wherein said phase comparator is comprised of a circuit in which logic gates are combined and which has two comparative input ends and an instruction output end;

when an internal clock signal supplied to one of the comparative input ends advances with respect to a reference clock signal supplied to the other of the comparative input ends, a down instruction output is generated at the instruction output end; and when the internal clock signal is delayed with respect to the reference clock signal, an up instruction output is generated at the instruction output end, said output instructions being issued for a time interval corresponding to a respective phase difference.

* * * * *